(12) United States Patent
Appel

(10) Patent No.: US 7,442,626 B2
(45) Date of Patent: Oct. 28, 2008

(54) RECTANGULAR CONTACT USED AS A LOW VOLTAGE FUSE ELEMENT

(75) Inventor: Andrew T. Appel, Bloomington, IN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/875,847

(22) Filed: Jun. 24, 2004

(65) Prior Publication Data

US 2004/0227612 A1    Nov. 18, 2004

Related U.S. Application Data

(62) Division of application No. 10/235,268, filed on Sep. 5, 2002, now Pat. No. 6,774,457.

(60) Provisional application No. 60/322,190, filed on Sep. 13, 2001.

(51) Int. Cl.
*H01L 21/326* (2006.01)
*H01L 21/479* (2006.01)

(52) U.S. Cl. .............. 438/467; 438/131; 438/132; 438/215; 438/281; 438/333; 438/601; 438/600; 438/957; 257/700; 257/758; 257/529; 257/530; 257/209; 257/211; 257/E23.149

(58) Field of Classification Search ............... 438/137, 438/131, 132, 215, 281, 333, 467, 601, 600, 438/957; 257/529, 686, 758, 690, 700, 530, 257/209, 211, E23.149; 361/803, 767, 777, 361/804, 735

See application file for complete search history.

(56) References Cited

U.S. PATENT DOCUMENTS

| | | | |
|---|---|---|---|
| 4,748,491 A | 5/1988 | Takagi | |
| 5,436,496 A | 7/1995 | Jerome et al. | |
| 5,444,012 A | 8/1995 | Yoshizumi et al. | |
| 5,640,036 A * | 6/1997 | Lee et al. | 257/355 |
| 5,679,902 A * | 10/1997 | Ryhanen | 73/78 |
| 5,789,794 A | 8/1998 | Froehner | |
| 5,798,475 A | 8/1998 | Reynes et al. | |
| 5,844,297 A * | 12/1998 | Crafts et al. | 257/530 |
| 5,854,510 A | 12/1998 | Sur, Jr. et al. | |

(Continued)

FOREIGN PATENT DOCUMENTS

EP    0 853 341 A2    7/1998

*Primary Examiner*—Phuc T Dang
*Assistant Examiner*—Thanh Y Tran
(74) *Attorney, Agent, or Firm*—Wade J. Brady, III; Frederick J. Telecky, Jr.

(57) ABSTRACT

A repair fuse element and method of construction are disclosed that eliminate or substantially reduce the disadvantages and problems associated with prior fuse elements. In one embodiment, the fuse element is constructed with a rectangular-shaped contact. The contact is made long enough so that it makes contact at each end with a metal layer, but design rule spacing is still maintained between the connections with the metal layer. The overlapping areas between the rectangular contact and the metal layers are asymmetrical. Alternatively, these overlapping areas are smaller than the design rule overlap requirements. In a second embodiment, a fuse element is constructed with a plurality of rectangular-shaped contacts. As a result, a current value that is significantly lower than conventional fuse current values, can be used to melt such a contact or blow the fuse.

12 Claims, 2 Drawing Sheets

U.S. PATENT DOCUMENTS

| | | |
|---|---|---|
| 6,166,421 A * | 12/2000 | Kalnitsky et al. ........... 257/529 |
| 6,258,700 B1 | 7/2001 | Bohr et al. |
| 6,420,217 B1 | 7/2002 | Kalnitsky et al. |
| 6,432,760 B1 | 8/2002 | Kothandaraman et al. |
| 6,444,558 B1 * | 9/2002 | Cutter et al. ................ 438/600 |
| 6,452,248 B1 | 9/2002 | Le |
| 6,531,757 B2 | 3/2003 | Shiratake |
| 6,566,238 B2 | 5/2003 | Brintzinger et al. |
| 6,580,144 B2 | 6/2003 | Anthony |
| 6,642,601 B2 | 11/2003 | Marshall et al. |
| 6,649,997 B2 | 11/2003 | Koike |
| 6,653,710 B2 | 11/2003 | Adkisson et al. |
| 6,657,531 B2 | 12/2003 | Kimura et al. |
| 6,667,537 B1 | 12/2003 | Koike et al. |
| 6,689,644 B2 | 2/2004 | Johnson |
| 6,692,994 B2 | 2/2004 | Davis et al. |
| 6,703,680 B2 | 3/2004 | Toyoshima |
| 6,704,235 B2 | 3/2004 | Knall et al. |
| 2001/0017755 A1 * | 8/2001 | Toyoshima .................. 361/56 |
| 2002/0086462 A1 * | 7/2002 | Kothandaraman et al. ... 438/132 |

* cited by examiner

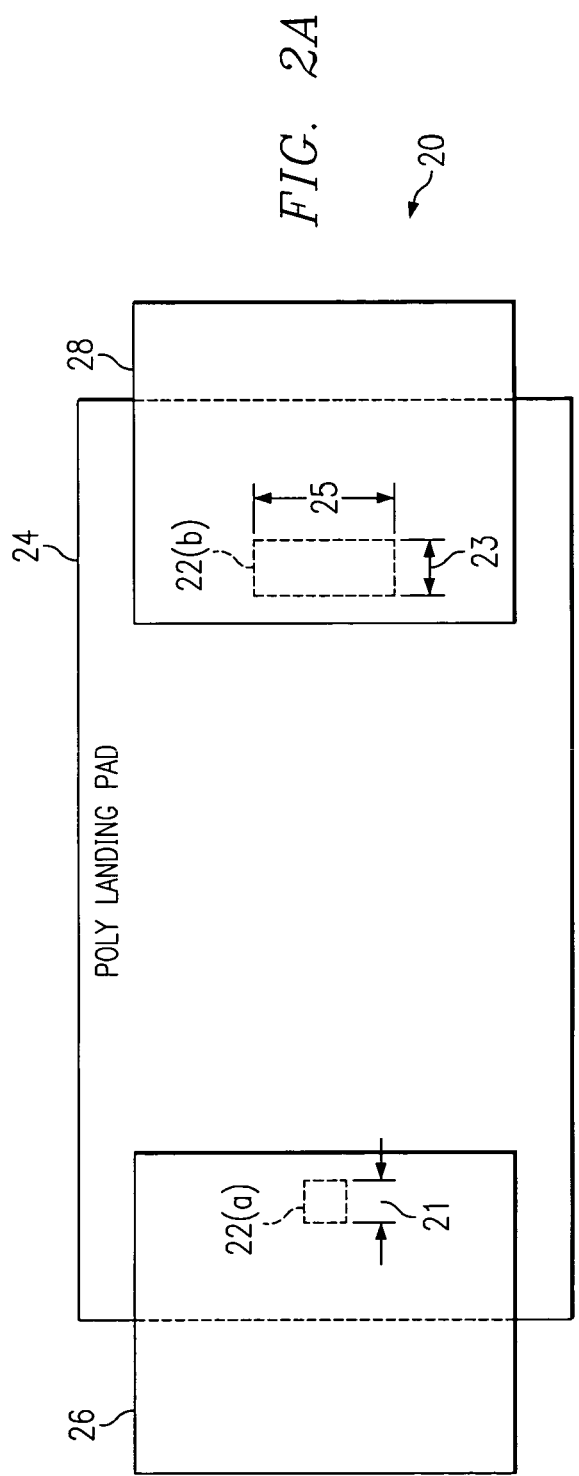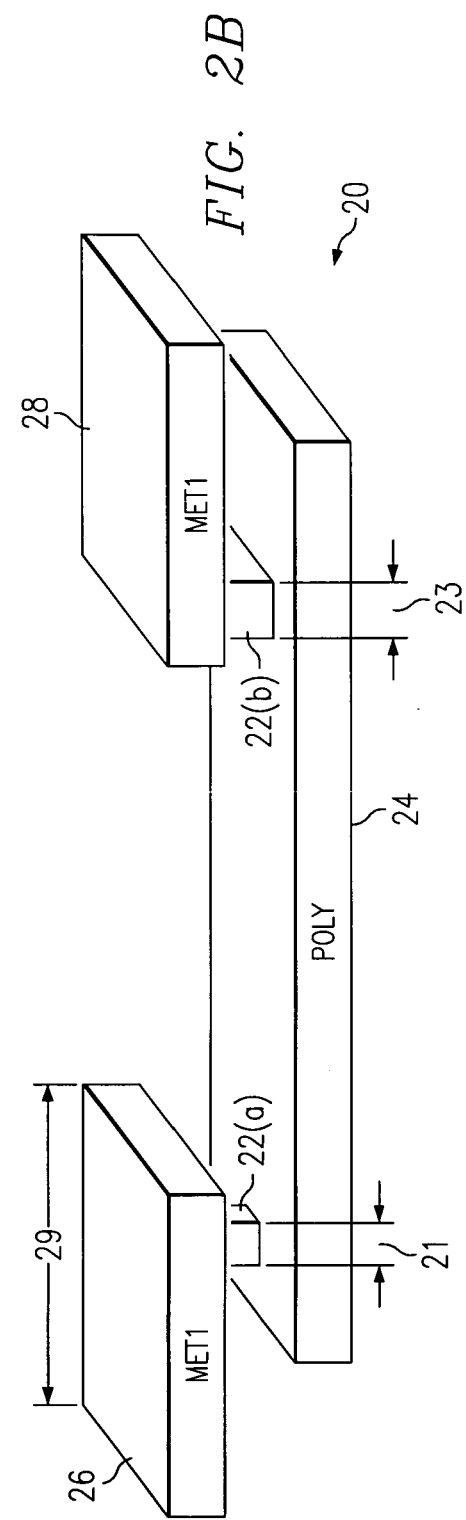

RECTANGULAR CONTACT USED AS A LOW VOLTAGE FUSE ELEMENT

This is a divisional application of Ser. No. 10/235,268 filed Sep. 5, 2002 now U.S. Pat. No. 6,774,457 which is a non-provisional application of provisional application No. 60/322,190 filed Sep. 13, 2001.

TECHNICAL FIELD OF THE INVENTION

The present invention relates in general to the semiconductor processing field and, in particular, to a low voltage fuse element and method of fabrication.

BACKGROUND OF THE INVENTION

Certain semiconductor devices, such as dynamic random access memories (DRAMs) and static RAMs (SRAMs), are designed with redundant rows and/or columns of memory bits. The redundant rows and columns can be connected into a memory array to substitute for memory cells found defective during the testing and inspection process. This connection can be made by blowing selected fuses that are strategically located in the memory array and the redundant rows and columns. Typically, these fuses are made of polysilicon formed on a field oxide layer simultaneously with a gate electrode. Alternatively, these fuses can be made of a metal material.

A significant problem experienced with conventional polysilicon fuses is that they have relatively high inherent and parasitic resistances. On the other hand, the current required to blow such a polysilicon fuse is relatively low. A significant problem experienced with conventional metal fuses is that they require exceedingly high currents to make them blow. However, the inherent resistance of such metal fuses is relatively low.

SUMMARY OF THE INVENTION

Accordingly, there is a need for a fuse element with low inherent resistance, which also requires a low amount of current to melt the fuse element and make it blow.

In accordance with the present invention, a fuse element and method of construction are provided that eliminate or substantially reduce the disadvantages and problems associated with prior fuse elements.

In one embodiment of the present invention, a fuse element is constructed with a rectangular-shaped contact. The contact is made long enough so that it makes contact at each end with a metal layer, but design rule spacing is still maintained between the connections with the metal layer. In this embodiment, a polysilicon plate under the fuse element is primarily to land the contacts and does not carry any of the fusing current. In one aspect, the overlapping areas between the rectangular contact and the metal layers are selected to be asymmetrical. Alternatively, in another aspect, one or more of these overlapping areas is selected to be smaller than the design rule overlap requirements.

In a second embodiment of the present invention, a fuse element is constructed with a plurality of rectangular-shaped contacts. In this case, to overlapping areas of the metal layer and contacts are selected to be asymmetrical. In this embodiment, the polysilicon supports the fusing element, but is not the fusing element.

An important technical advantage of the present invention is that a fuse element is provided which has significantly lower inherent resistance and parasitic resistance than prior polysilicon fuses.

Another important technical advantage of the present invention is that a fuse element is provided which requires a significantly lower amount of current to blow than prior metal fuses.

Still another important technical advantage of the present invention is that a fuse element is provided which requires a significantly lower blow voltage than that used for prior fuses.

Yet another important technical advantage of the present invention is that a fuse element is provided with a small overlap area between a contact and a metal layer, which can generate very high interfacial current densities in a relatively compact layout.

Other technical advantages of the present invention will be readily apparent to one skilled in the art from the following figures, description and claims.

BRIEF DESCRIPTION OF THE DRAWINGS

For a more complete understanding of the present invention and its advantages, reference is now made to the following descriptions, taken in conjunction with the accompanying drawings, in which:

FIG. 2A is a cross-sectional view of a fuse element constructed in accordance with a second embodiment of the present invention; and FIG. 2B is a perspective view of the fuse element shown in FIG. 2A.

DETAILED DESCRIPTION OF THE DRAWINGS

The preferred embodiments of the present invention and its advantages are best understood by referring to FIGS. 1A-2B of the drawings, like numerals being used for like and corresponding parts of the various drawings.

Figure 1A:
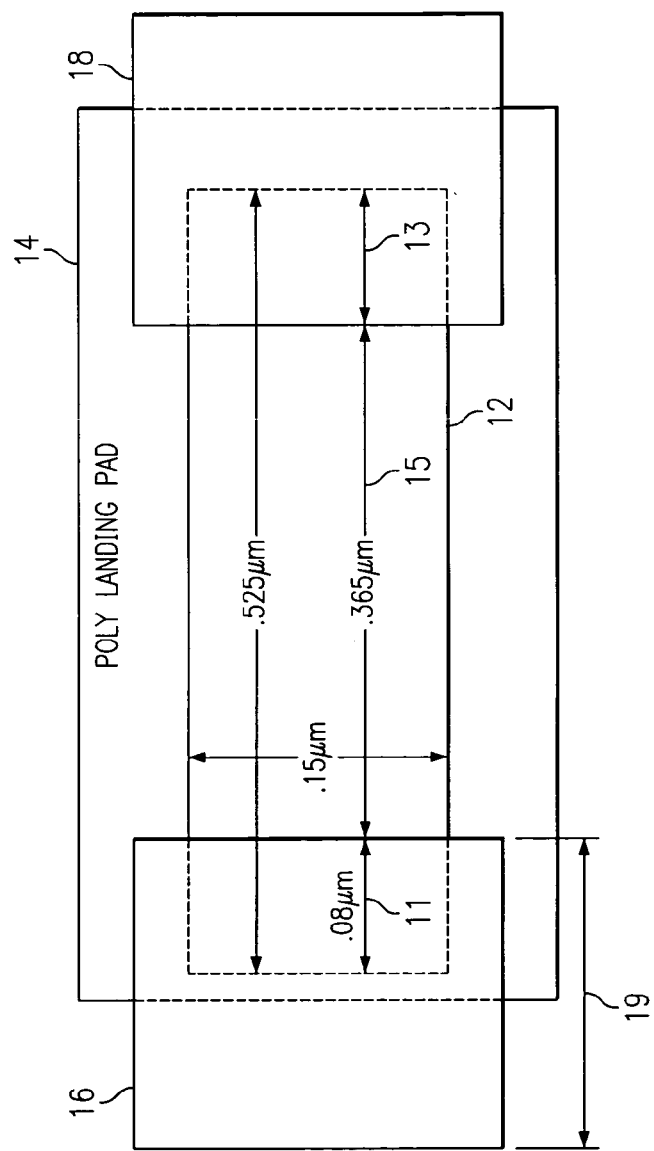
FIG. 1A is a cross-sectional view of a fuse element constructed in accordance with an embodiment of the present invention.
Figure 1B:
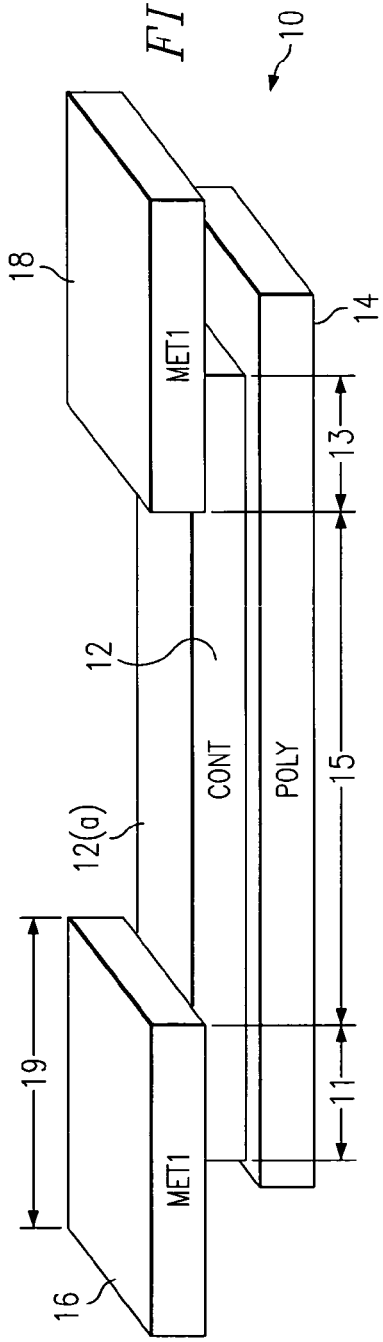
FIG. 1B is a perspective view of the fuse element shown in FIG. 1A.

FIG. 1A is a cross-sectional view of a fuse element constructed in accordance with an embodiment of the present invention. FIG. 1B is a perspective view of the fuse element shown in FIG. 1A. Referring to FIGS. 1A and 1B, a fuse element 10 is shown. For example, fuse element 10 can be strategically located in a DRAM or SRAM memory array and/or in redundant columns and: rows. As such, fuse element 10 can be located in any appropriate semiconductor device that incorporates electrical fuses for memory or circuitry repair.

Fuse element 10 includes a substantially rectangular-shaped contact 12. For this exemplary embodiment, the contact 12 is formed on a polysilicon layer or landing pad 14. The contact 12 is formed by filling the contact area with tungsten. A lead wire (not shown) connected to the contact 12 can be copper with a tantalum nitride liner. The lead wire can carry a current used to melt or blow the fuse.

A first metal line 16 and second metal line 18 of a metal layer, MET1, each overlay respective end of the contact 12. For example, the metal layer, MET1, can form a first layer of a multi-level metal stack in a multi-metal level semiconductor device. Typically, such a stack can include a plurality of levels of metal and inter-level oxide or dielectric layers.

Referring to FIG. 1A, for this exemplary embodiment, the dimensions of the rectangular contact surface 12($a$) (facing upwards in FIG. 1B) of contact 12 are 0.15 µm by 0.525 µm. It is to be understood that the thickness dimension of the contact 12 (distance between MET-1 layer and polysilicon layer) is not significantly related to the function of the present invention and can be determined by conventional design rules. Preferably, the minimum distance or spacing 15 between the first metal line 16 and the second metal line 18 of the metal layer, MET1, is 0.175 μm. However, for this embodiment, this distance or spacing 15 between the metal lines 16, 18 is selected to be 0.365 μm.

According to design rules for the fuse element 10 configuration shown in FIGS. 1A and 1B, each of the lengths 11 and 13 by which the respective metal lines 16 and 18 overlap the contact surface 12(*a*) is 0.05 μm. Preferably, however, for this embodiment, the overlap dimensions 11 and 13 are each selected to be 0.08 μm long. Using this overlap value of approximately 0.08 μm ensures that each of the overlapping areas is large enough so that an open contact is not formed (e.g., at T0).

Preferably, the minimum thickness of the metal layer, MET1, is 2,500 Angstroms. As such, the $J_{rms}$ limit for the metal layer, MET1, is 2.5E6 A/cm². If the metal line (16 or 18) to contact surface 12(*a*) overlap is 0.05 μm, the width 19 of the metal layer, MT1, is 0.25 μm. Moreover, the average current, $I_{rms}$ of the metal layer, MT1, is 1.53 mA. Thus, the current density at a metal line 16, 18 to contact 12 overlap is 12.75E6 A/cm², 5.1×width of the lead (not shown). The width of the lead can be increased in order to increase the $I_{rms}$ value for the metal layer, MT1.

In operation, the fuse element 10 can be used, for example, as an electrically programmable fuse. The contact 12 can be connected to a floating polysilicon element of a memory array and/or redundant rows and columns. In order to blow the fuse 10, a current is conveyed through the body of the contact 12 between the two MET1 lines 16, 18. If the metal line 16, 18 to contact 12 overlaps are selected to be asymmetrical (e.g., the overlap of metal line 16 to contact 12 is smaller than the overlap of metal line 18 to contact 12, or vice versa), then a current value which is significantly lower than conventional fuse current values, can be used to melt the MET1-CONT interface (16/12) and blow the fuse. Alternatively, if either of the metal line 16, 18 to contact 12 overlap dimensions is selected to be smaller than the design rule overlap dimension for such a fuse element configuration (e.g., the overlap of metal line 16 to contact 12 is smaller than the design rule for a metal line to contact overlap), then a current value which is significantly lower than conventional fuse current values, can be used to melt the MET1-CONT interface (16/12) and blow the fuse. Consequently, a significant additional advantage of the present invention is that a low voltage supply can be used to melt or blow such a fuse.

FIG. 2A is a cross-sectional view of a fuse element constructed in accordance with a second embodiment of the present invention. FIG. 2B is a perspective view of the fuse element shown in FIG. 2A. Referring to FIGS. 2A and 2B, a fuse element 20 is shown. Fuse element 20 includes a plurality of substantially rectangular-shaped contacts 22(*a*) and 22(*b*). For this exemplary embodiment, the contacts 22(*a*) and 22(*b*) are formed on a polysilicon layer or landing pad 24. The contacts 22(*a*) and 22(*b*) can be formed by filling the contact areas with tungsten. A lead wire (not shown) connected to a contact 22(*a*) and/or 22(*b*) can be copper with a tantalum nitride liner. The lead wire can carry a current used to melt or blow the fuse.

A first metal line 26 and second metal line 28 of a metal layer, MET1, each overlay a surface of a respective contact 22(*a*) and 22(*b*). Preferably, for this embodiment, the overlap dimensions 21 and 23 are each selected to be 0.08 μm. Using this overlap value of approximately 0.08 μm ensures that each of the overlapping areas is large enough so that an open contact is not formed (e.g., at T0). The width of the contact 22(*a*) can be 0.08 μm, because the contact surface of contact, 22(*a*) is substantially square. The width of the contact 22(*b*) can be 0.15 μm, which is similar to the width of contact 12 shown in FIGS. 1A and 1B.

Preferably, the minimum thickness of the metal layer, MET1, is 2,500 Angstroms. As such, the $J_{rms}$ limit for the metal layer, MET1, is 2.5E6 A/cm². If the metal line 26 to contact surface 22(*a*) overlap is 0.05 μm, the width 29 of the metal layer, MT1, is 0.25 μm. Moreover, the average current, $I_{rms}$, of the metal layer, MT1, is 1.53 mA. Thus, the current density at the metal line 26 to contact 22(*a*) overlap is 12.75E6 A/cm², 5.1×width of the lead (not shown). As such, the width of the lead can be increased in order to increase the $I_{rms}$ value for the metal layer, MT1. The operation of the second embodiment is essentially similar to that of the first embodiment described above. However, for the second embodiment, since the overlapping surfaces of the metal lines 26, 28 to the contacts 22(*a*), 22(*b*), respectively, are asymmetrical, then a current value which is significantly lower than conventional fuse current values, can be used to melt the MET1-CONT interface (26/22(*a*)) and blow the fuse.

Although a preferred embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A method for fabricating a fuse element for a semiconductor device, comprising the steps of:
   providing a substrate having at least one dielectric layer formed thereon;
   forming a polysilicon layer on said dielectric layer;
   forming a contact layer on said polysilicon layer, said contact layer defining one or more contacts on said polysilicon layer; and
   forming a first metal line and a second metal line from at least one metal layer on said contact layer, said first metal line contacting a first portion of at least one of said contacts to form a first interface, said second metal line contacting a second portion of said one of said contacts to form a second interface, wherein an area of at least one of said first and said second interfaces is sufficiently small so that said one interface has a fuse current lower than a fuse current of any other portion of said fuse element, and wherein an area of said first interface is smaller than an area of said second interface.

2. The method of claim 1, wherein said step of forming said said first and said second metal lines further comprises the steps of:
   forming said first metal line to overlap a first portion of at least one of said contacts by a first predetermined distance to form said first interface; and
   forming said second metal line to overlap a second portion of said one contact by a second predetermined distance to form second interface.

3. The method of claim 2, wherein said first predetermined distance is less than said second predetermined distance.

4. The method of claim 2, wherein at least one distance of said first distance and said second distance is approximately 0.08 μm.

5. The method of claim 2, wherein said contacts comprise a tungsten material.

6. The method of claim 1, wherein said contacts further comprise a first contact and a second contact.

7. The method of claim 6, wherein wherein the step of forming further comprises:
- forming said first metal line to overlap a portion of said first contact to form said first interface; and
- forming said second metal line to overlap a portion of said second contact to form said second interface, said first interface having a smaller area as compared to said second interface.

8. A method for fabricating a fuse element for a semiconductor device, comprising the steps of:
- providing a substrate having at least one dielectric layer formed thereon;
- forming a polysilicon layer on said dielectric layer;
- forming a contact layer on said polysilicon layer, said contact layer defining a contact on said polysilicon layer; and
- forming a first metal line and a second metal lines from at least one metal layer on said contact layer, said first metal line contacting a first portion of said contact to form a first interface, said second metal line contacting a second portion of said contact to form a second interface, wherein an area of at least one of said interfaces is sufficiently small so that said one interface has a fuse current lower than a fuse current of any other portion of said fuse element, wherein an area of said first interface is smaller than an area of said second interface.

9. The method of claim 8, wherein said step of forming said plurality of metal lines further comprises the steps of:
- forming said first metal line to overlap said first portion of said contact by a first predetermined distance to form said first of said interfaces; and
- forming said second metal line to overlap said second portion of said contact by a second predetermined distance to form said second of said interfaces.

10. The method of claim 9, wherein said first predetermined distance is less than said second predetermined distance.

11. The method of claim 9, wherein at least one distance of said first distance and said second distance is approximately 0.08 µm.

12. The method of claim 8, wherein said contact comprises a tungsten material.

* * * * *